United States Patent [19]
Rottinghaus

[11] Patent Number: 5,483,203
[45] Date of Patent: Jan. 9, 1996

[54] FREQUENCY SYNTHESIZER HAVING MODULATION DEVIATION CORRECTION VIA PRESTEERING STIMULUS

[75] Inventor: Alan P. Rottinghaus, Barrington, Ill.

[73] Assignee: Motorola, Inc., Schaumburg, Ill.

[21] Appl. No.: 332,973

[22] Filed: Nov. 1, 1994

[51] Int. Cl.⁶ ............................. H03C 3/09; H03L 7/189
[52] U.S. Cl. .................... 331/10; 331/16; 331/17; 331/25; 332/127; 455/76; 455/113; 455/119
[58] Field of Search .................... 332/127, 128; 331/1 A, 16, 17, 25, 10; 455/76, 113, 119

[56] References Cited

U.S. PATENT DOCUMENTS 5,027,087  6/1991  Rottinghaus .................... 332/127
5,036,295  7/1991  Kamitani ........................ 331/10
5,207,491  5/1993  Rottinghaus .................... 331/16

Primary Examiner—Siegfried H. Grimm
Attorney, Agent, or Firm—Val Jean F. Hillman

[57] ABSTRACT

A frequency synthesizer 10 having a digital to analog converter (DAC) 40 and a feedback system which detects the deviation of a frequency modulated signal and aligns the detected deviation. DAC 40 provides a presteering stimulus for alignment purposes. After presteering alignment, the gain of DAC 40 is accurately set for frequency deviation because modulation is sourced from the same digital to analog converter that performs presteering.

10 Claims, 2 Drawing Sheets

FREQUENCY SYNTHESIZER HAVING MODULATION DEVIATION CORRECTION VIA PRESTEERING STIMULUS

FIELD OF THE INVENTION

The present invention relates to general purpose control systems and in particular an apparatus for use with frequency modulated and channelized spectrum communication devices which accurately, efficiently and optimally utilize an assigned frequency modulated channel.

BACKGROUND OF THE INVENTION

Current communication technology assigns or licenses a channel or a set of channels, identified by predefined bandwidths, to a particular type of transmitting device. The transmitting device has an "occupied bandwidth" which is the bandwidth in which a majority of the power or energy is limited. The occupied bandwidth must be less than the assigned or licensed bandwidth so that the operation of one device does not interfere with the operation of a device assigned a neighboring bandwidth. Under these general constraints, it is desirable to maximize the occupied bandwidth such that it closely approximates the assigned bandwidth without exceeding the boundaries of the assigned bandwidth.

In frequency modulated "FM systems", the occupied bandwidth of the transmitter is a function of both the modulating signal bandwidth (or symbol rate in digital FM) and the deviation. The deviation is typically a difficult to control parameter leading to one of several compromise situations. The first compromise situation is the use of precision components to decrease the variability of the deviation. Such precision components are rather expensive which leads to a rather substantial increase in the overall cost of the transmitting device. The second compromise situation is the use of labor intensive factory tuning. The factory tuning of a transmitting unit decreases the variability of the deviation but also adds to the cost as well as decreasing product reliability. Yet a third compromise situation is to use neither precision components nor factory tuning. In this third situation, the deviation tolerance is poor, meaning that the unit with the worst case maximum deviation must have an occupied bandwidth that is still within the assigned bandwidth. In this third situation, the average device has a deviation, and corresponding occupied bandwidth which is dramatically underutilized.

Prior art devices have used a synthesizer to generate frequencies that are phase locked to a given reference frequency. Switching from one output frequency to another is accomplished by changing the loop frequency divider coupled to the feedback and then allowing the loop feedback control system to "slowly" take the voltage controlled oscillator from the old frequency to the new frequency.

Prior art devices have used a step voltage to "presteer" the voltage controlled oscillator to the new frequency in a short period of time. Some prior art devices also provide a feedback mechanism to keep the step voltage at a nominal value. This type of feedback mechanism, in all of its varying embodiments, waits for a steady state condition to develop in the loop and then directly measures the voltage applied to the VCO relative to that which was "injected" for presteering purposes. Such a mechanism is relatively slow, since it must wait for steady state and is generally less accurate because of the small size of the voltage at the VCO and the error in directly measuring the voltage applied to the VCO.

U.S. Pat. No. 5,027,087 to Rottinghaus (hereinafter referred to as "Rottinghaus '087"), assigned to the assignee of record in the present application, discloses a feedback apparatus and method in the context of frequency presteering. The feedback technique disclosed in Rottinghaus '087 measures the loop transient response following the injection of a presteering voltage step. By examining the slope of the feedback transient, the size of the presteering voltage step can be determined to be, "too large", or "too small", thereby allowing correction of the presteering voltage in accordance with an algorithm. The device and method as shown in Rottinghaus '087 provides better results than other prior art devices and methods since the detection of the accuracy of the step voltage can be done immediately following the step without waiting for a steady state to develop in the loop. The device and method of Rottinghaus '087 generally is not subject to measurement errors of voltage gain or offset since the device and method is simply observing the loop response to the error in the presteering step. In other words, the function of the loop, switching between frequencies, is replaced by a presteering mechanism within the same loop which is made more accurate through a feedback technique.

Rottinghaus '087 also discloses a method for aligning the modulator. Once the presteering step is aligned for a given frequency transition, the slope of the VCO is known. The slope information can also be used to control the FM deviation of the modulator. This method for aligning the modulator works well, but only within a certain tolerance.

Another apparatus and method as shown in U.S. Pat. No. 5,207,491 to Rottinghaus (hereinafter referred to as "Rottinghaus '491"), which is assigned to the assignee of the present invention, attempts to improve upon the teachings of Rottinghaus '087. Rottinghaus '491 shows a presteering transient wave form which replaces the simple step voltage of Rottinghaus '087. Also disclosed in Rottinghaus '491 is a method of measuring the output of a phase detector. Two algorithmic embodiments are disclosed for post processing the measured phase detector output. The purpose of this post processing is to correct the transient response size and shape. In other words, while Rottinghaus '087 corrected the size of the transient response, Rottinghaus '491 attempts to correct both the size and shape.

While the Rottinghaus '087 and '491 devices and methods attempt to improve the use of an assigned bandwidth, these prior art references fall short of teaching devices and/or methods that optimize and efficiently use an assigned bandwidth. As such, it would be desirable to provide a device and method for optimizing the use of an assigned bandwidth with greater efficiency, precision and repeatability than prior art devices and methods.

DETAILED DESCRIPTION OF THE PREFERRED EMBODIMENT

Figure 1:
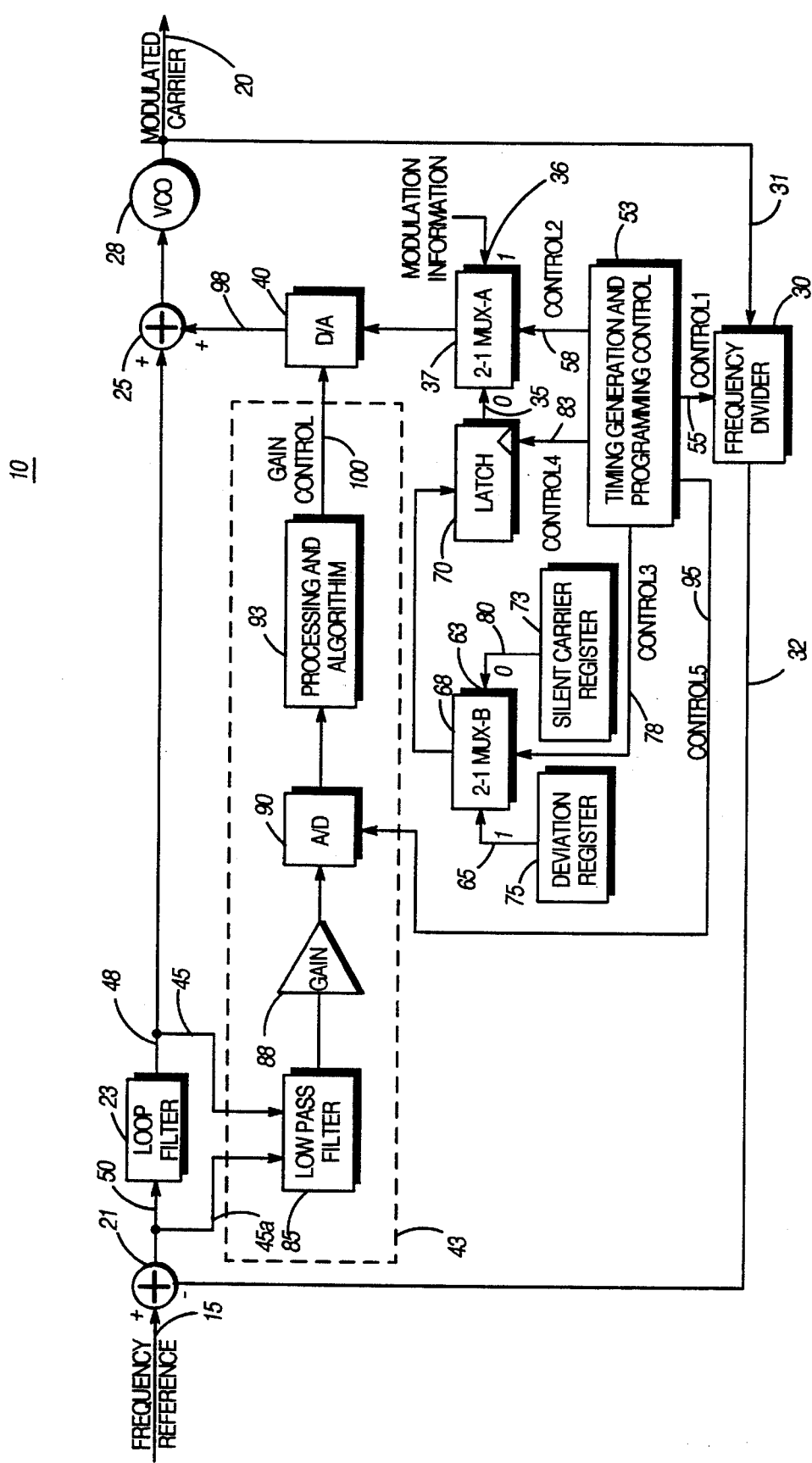
FIG. 1 is a block diagram of a frequency synthesizer in accordance with the present invention.

With reference to FIG. 1, a frequency synthesizer 10 is shown having an input 15 providing a frequency reference and an output 20 providing a modulated carrier. The synthesizer 10 includes a phase detector 21, loop filter 23, a summer 25 and a voltage controlled oscillator (VCO) 28. The loop filter 23 is coupled to the reference frequency 15 via the phase detector 21 and to the summer 25. As will be appreciated, loop filter 23 removes unwanted components from the phase detector 21 output. The VCO is coupled to the summer 25 and to the modulator carrier output 20. A frequency divider 30 has an input 31 coupled to the output 20 and an output 32 coupled to the loop filter 23 via the phase detector 21.

The synthesizer 10 also includes a first multiplexer or MUX-A 33 which has a first input 35, second input 36 and third input 37. A digital to analog converter (DAC) 40 is coupled to the summer 25 and MUX-A 33. A deviation control circuit 43 is coupled to the DAC 40. In a preferred embodiment of the present invention, a feedback input 45 to the deviation control circuit 43 is coupled to an input 50 of the loop filter 23.

A timing generation and programming controller 53 has a first control line 55 coupled to the frequency divider 30 and a second control line 58 coupled to the third input 37 of MUX-A 33. A second multiplexer of MUX-B 60 has a first input 63, a second input 65 and an output 68. A latch 70 is coupled to the output 68 of the MUX-B 60 and to the first input 35 of MUX-A 33. A silent carrier register 73 is coupled to said MUX-B 60. The timing generation and programming controller 53 includes a third control line 78 coupled to a third input 80 of MUX-B 60 and a fourth control line 83 coupled to said latch 70.

The deviation control circuit includes a low pass filter 85, a gain control 88, an analog to digital converter (ADC) 90, and a processing and algorithm circuit 93. The low pass filter 85 is coupled to the frequency input 15 by way of the feedback 45 after the loop filter 23 or the input 45a taken before the loop filter 23. The gain control is coupled to the low pass filter 85 and the ADC 90. The processing and algorithm circuit 93 is coupled to the ADC and the DAC 40. The timing generation and programming control circuit 53 includes a fifth control line 95 coupled to the ADC 90.

The DAC 40 provides or sources both the frequency presteering and FM modulation. In this effort, the DAC provides a mechanism for detection and control of the modulator deviation. Detection is achieved by temporarily making DAC 40 the source of presteering in the frequency locked-loop of synthesizer 10. With DAC 40 performing the presteering, the loop changes frequency. Slowly, the presteering converges as the gain of the DAC is modified iteratively. If the frequency step of the synthesizer, assisted by DAC 40, is small (on the order of the size of the peak FM deviation), then the DAC gain is now properly set for both presteering and inherently the FM deviation. The small frequency step size of the synthesizer is typically within the capability of the frequency divider 30 in the feedback since the peak deviation roughly corresponds to the channel spacing in most systems.

The present invention employs DAC 40 to not only switch between the digital modulator baseband signal 36 and silent carrier register 73 content but also to switch from silent carrier register 73 content to a deviation register 75 content. The transition at an output 98 of DAC 40 from the silent carrier register 73 content to the deviation register 75 content creates a step in voltage used to presteer the VCO 28 to a new frequency. The divide ratio in the synthesizer 10 changes at the same time as the step from the DAC 40 output 98 is injected. If the change in frequency caused by the voltage injection at the output 98 is that which is dictated by the change in the divide ratio, then the loop is in a steady state condition before and immediately after the transition. The change in frequency caused by the presteering step (from the silent carrier voltage to the deviation register voltage) should be similar to the peak deviation of the modulation (which is the deviation from the silent carrier level). Thus, proper scaling for presteering inherently equates to proper scaling for modulation since the ratio between the two is fixed. Assuming a modulation peak deviation of 4.75 MHz and a presteering step of 5 MHz, the fixed ratio may be described as 5 MHz/4.75 MHz.

Figure 2:
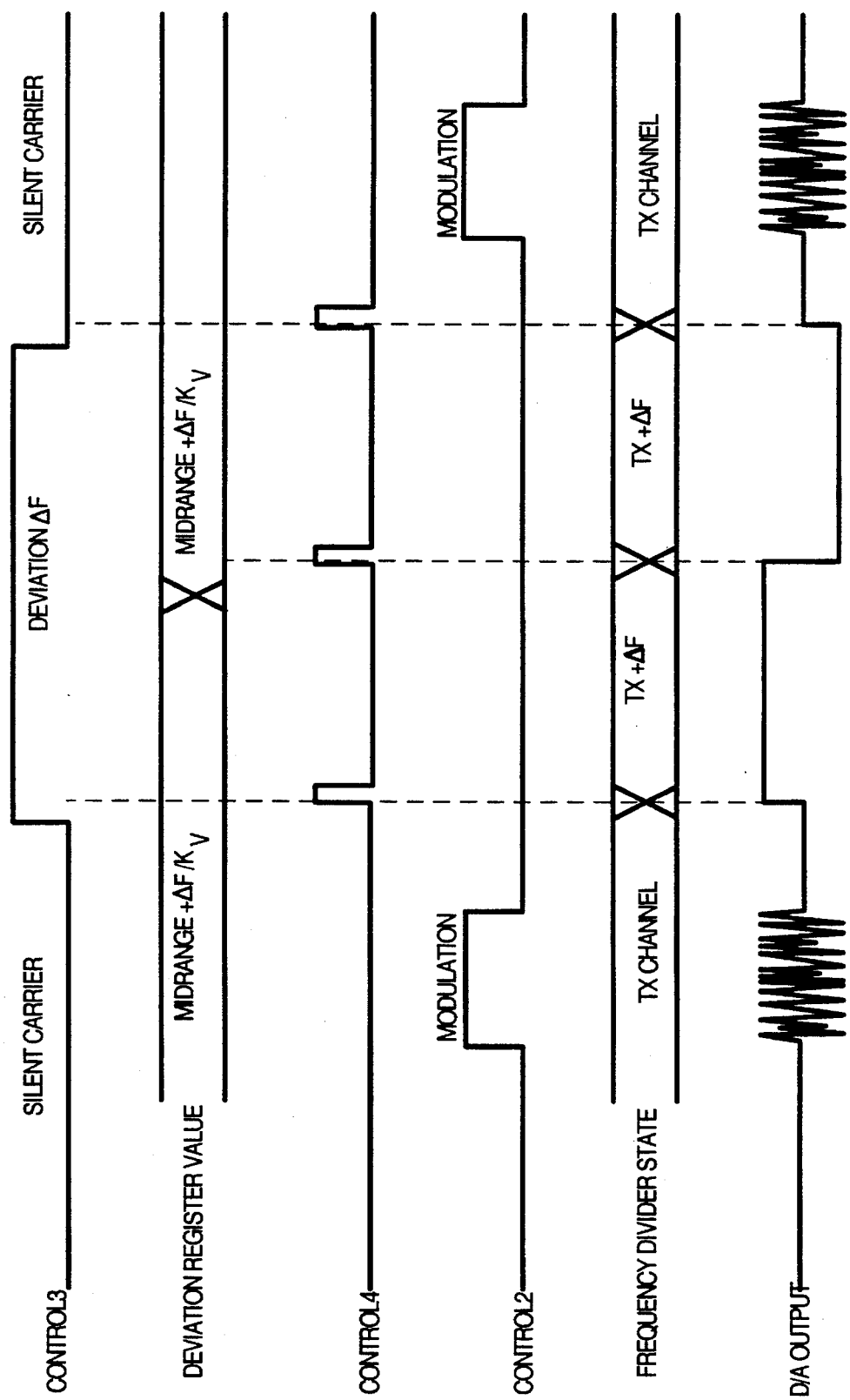
FIG. 2 is a timing diagram for the frequency synthesizer of FIG. 1.

With further reference to the timing diagram as shown in FIG. 2, MUX-B 60 can be switched from the silent carrier value to the deviation register value by the third control line 78 and is latched into the DAC by the fourth control line 83 simultaneously with the change in the divider requested by the first control line 55. By way of example, assume that the presteering step from silent carrier to the positive deviation value of 5 MHz is programmed in the deviation register 75, loop filter 23 is employed to determine whether the presteering step is too large or too small. The feedback signal 45 from loop filter 23 or 45a from phase detector 21 is sampled by the ADC 90 and used in an algorithm in the processing and algorithm circuit 93, an output of which 100 is used to control the gain of the DAC 40. If the presteering step is too small, then the feedback will provide an increasing signal at the output of the phase detector 21 (assuming no inversion in the loop filter). This output can be used by the processing and algorithm circuit 93 to increase the gain of DAC 40. The processing and algorithm circuit 93 is a digital integrator with a programmable depth of integration. The integrator 93 is incremented or decremented depending upon the slope (±) of the feedback signal immediately following a frequency transition assisted by the presteering described herein. If the deviation register 75 is programmed in a correct ratio to the peak deviation of the modulation information and the presteering mechanism has converged (meaning the presteering step voltage is such that steady state is seen in the loop before and immediately after the frequency transition) then the deviation will also be precisely set.

It will be appreciated by those skilled in the art that positive and negative presteering voltage step signals of varying magnitudes can be achieved by changing the deviation register 75 content (i.e., polarity or magnitude) or by creating steps that transition from either the silent carrier register to the deviation register or vice versa. It will further be appreciated that additional presteering voltage step signals can be achieved by transitions from one deviation register 75 value to another.

In summary, the present invention is a frequency synthesizer having a digital to analog converter (DAC) and a feedback system which detects the deviation of a frequency modulated signal and aligns the detected deviation. The DAC provides a presteering stimulus for alignment purposes. After presteering alignment, the gain of the DAC is accurately set for frequency deviation because modulation is sourced from the same digital to analog converter that performs presteering. As a consequence, the present invention benefits from the optimization of the occupied bandwidth and the continuous alignment of the occupied bandwidth within the assigned bandwidth, despite the elimination of precision components and the manual tuning of said components.

What is claimed is:

1. A frequency synthesizer having a feedback system which detects the deviation of a frequency modulated signal and aligns the frequency deviation, said frequency synthesizer comprising:

a frequency reference input;

a summer coupled to said reference input;

a voltage controlled oscillator (VCO) having an input coupled to said summer and an output;

a frequency divider having an input coupled to said VCO output and an output coupled to said reference input;

a first multiplexer (MUX) having a first, second and third input and an output;

a first register coupled to said first input of said first MUX;

a modulation signal source coupled to said second input of said first MUX;

a controller having a first control line coupled to said frequency divider and a second control line coupled to said third input of said first MUX; and a digital to analog converter (DAC) coupled to said summer and to said output from said first MUX, said DAC providing a presteering stimulus and a mechanism for controlling the frequency deviation of the modulated signal, such that the DAC automatically and continuously aligns the frequency deviation of said frequency synthesizer during presteering.

2. The frequency synthesizer of claim 1 further comprising a second MUX having a first, second and a third input and an output, said output being coupled to said first input of said first MUX, said first register being coupled to said first input of said second MUX, a second register being coupled to said second input of said second MUX, and said controller having a third control line being coupled to said third input of said second MUX.

3. The frequency synthesizer of claim 2 further comprising a latch having an input coupled to said output of said second MUX and an output coupled to said first input of said first MUX, said controller having a forth control line coupled to said latch, such that said second MUX is selectively switched from said first register to said second register by said controller, said second MUX being latched to the DAC via the first MUX with a simultaneous change in the first and the fourth control lines.

4. The frequency synthesizer of claim 1 further comprising a phase detector having an input coupled to said reference input and an output.

5. The frequency synthesizer of claim 4 further comprising a loop filter having at input coupled to said phase detector output and an output coupled to said summer.

6. The frequency synthesizer of claim 5 further comprising a frequency presteering deviation control circuit having an input coupled to said output of said loop filter and an output coupled to the DAC.

7. The frequency synthesizer of claim 1 wherein the DAC provides a presteering stimulus and the modulation information to the synthesizer.

8. In a phase locked loop (PLL) frequency synthesizer having a voltage controlled oscillator (VCO), a digital to analog converter (DAC) for receiving a presteering voltage step and a feedback system, a method for detecting and aligning frequency deviation, said method comprising the steps of:

injecting a presteering voltage step signal into the loop by:
selectively switching from a first register content to a second register content; and
utilizing the second register content to generate the presteering voltage step;

examining a slope of the feedback system transient to determine whether the presteering voltage step is appropriate in size and shape; and adjusting the DAC gain as a function of the feedback system transient, such that the DAC automatically and continuously aligns the frequency deviation of said frequency synthesizer during frequency presteering.

9. The method of claim 8 wherein the step of injecting a presteering voltage step signal into the loop further comprises the steps of:

selectively switching from the second register content to the first register content; and utilizing the first register content to generate the presteering voltage step.

10. The method of claim 8 wherein the step of injecting a presteering voltage step signal into the loop further comprises the steps of:

switching from a first second register content to another second register content; and utilizing the other second register content to generate the presteering voltage step.

* * * * *